(12) United States Patent
Kim

(10) Patent No.: US 9,564,246 B2
(45) Date of Patent: Feb. 7, 2017

(54) SEMICONDUCTOR DEVICE AND OPERATING METHOD THEREOF

(71) Applicant: SK hynix Inc., Gyeonggi-do (KR)

(72) Inventor: Sang Sik Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/794,244

(22) Filed: Jul. 8, 2015

(65) Prior Publication Data

US 2016/0232954 A1    Aug. 11, 2016

(30) Foreign Application Priority Data

Feb. 5, 2015 (KR) .................. 10-2015-0018075

(51) Int. Cl.
| G11C 15/00 | (2006.01) |
| G11C 29/50 | (2006.01) |
| G11C 16/34 | (2006.01) |
| G11C 29/42 | (2006.01) |

(52) U.S. Cl.
CPC ....... *G11C 29/50004* (2013.01); *G11C 16/349* (2013.01); *G11C 16/3495* (2013.01); *G11C 29/42* (2013.01)

(58) Field of Classification Search
CPC ......... G11C 15/00; G11C 29/00; G11C 15/04; G11C 29/50; G06F 12/02
USPC ............................. 365/49, 49.1, 201, 230.03
See application file for complete search history.

(56) References Cited

U.S. PATENT DOCUMENTS

2010/0037006 A1 *  2/2010  Chen .................. G06F 12/0246
                                                711/103
2014/0181434 A1    6/2014  Chau et al.

FOREIGN PATENT DOCUMENTS

KR     1020110059313    6/2011

* cited by examiner

*Primary Examiner* — Huan Hoang
(74) *Attorney, Agent, or Firm* — IP & T Group LLP

(57) ABSTRACT

A semiconductor device includes: memory blocks including main data storage units and cycling information storage units; a circuit group that performs a wear leveling operation on the memory blocks; and a control circuit that sets a threshold value based on the cycling information, and controls the circuit group so that the wear leveling operation is performed based on the set threshold value.

15 Claims, 5 Drawing Sheets

SEMICONDUCTOR DEVICE AND OPERATING METHOD THEREOF

CROSS-REFERENCE TO RELATED APPLICATION

The present application claims priority to Korean patent application number 10-2015-0018075, filed on Feb. 5, 2015, the entire disclosure of which is herein incorporated by reference in its entirety.

BACKGROUND

Field of the Invention

Various embodiments of the present invention relate to a semiconductor device and an operating method thereof, and more particularly, to a wear management method of a semiconductor device.

Discussion of Related Art

Semiconductor devices include a plurality of memory blocks for storing data and a circuit group for performing erase, program and read operations on the memory blocks, and a control circuit for controlling the circuit group A plurality of memory cells are included in the respective memory blocks. Electrons move between a substrate and the memory cell whenever erase operations or program operations are performed. Therefore, when the erase and program operations are repeated, the memory cells may be degraded, Accordingly, the memory blocks, which have a great cycling number, have greater wear than that of the memory blocks with lesser cycling number. The cycling denotes a single performance of the erase and program operations. Reliability of the memory blocks having greater wear is degraded more than the memory blocks having relatively lesser wear, so that it is necessary to manage wear of the semiconductor device.

SUMMARY

Various embodiments of the present invention are directed to a semiconductor device capable of effectively managing wear of a memory block, and an operating method thereof.

In an embodiment of the present invention, a semiconductor device may include: memory blocks including main data storage units and cycling information storage units; a circuit group configured to perform a wear leveling operation on the memory blocks; and a control circuit configured to set a threshold value based on the cycling information, and control the circuit group so that the wear leveling operation is performed based on the set threshold value.

In an embodiment of the present invention, a method of operating a semiconductor device may include: setting a reference value of the cycling number of memory blocks; setting a threshold value based on a result of a comparison between an average value of the cycling numbers and the reference value of the cycling number of the memory blocks; and performing a wear leveling operation based on the threshold value.

In an embodiment of the present invention, a method operating a semiconductor device may include: performing a test operation for setting a reference value of the cycling number of memory blocks; calculating an average value of the cycling numbers of the memory blocks; comparing the average value of the cycling numbers and the reference value of the cycling number, storing a first threshold value when the average value of the cycling numbers is less than the reference value of the cycling number, and storing a second threshold value less than the first threshold value when the average value of the cycling numbers is equal to or greater than the reference value of the cycling number; calculating a difference value between the cycling numbers of the memory block having the maximum cycling number and the cycling numbers of the memory block having the minimum cycling number among the memory blocks; comparing the difference value and the stored first or second threshold value; and performing a wear leveling operation when the difference value is greater than the stored first or second threshold value, and omitting the wear leveling operation when the difference value is equal to or less than the stored first or second threshold value The foregoing summary is illustrative only and is not intended to be in any way limiting. In addition to the illustrative aspects, embodiments, and features described above, further aspects, embodiments, and features will become apparent by reference to the drawings and the following detailed description,

BRIEF DESCRIPTION OF THE DRAWINGS

The above and other features and advantages of the present invention will become more apparent to those of ordinary skill in the art by describing in detail embodiments thereof with reference to the attached drawings in which.

DETAILED DESCRIPTION

Figure 1:
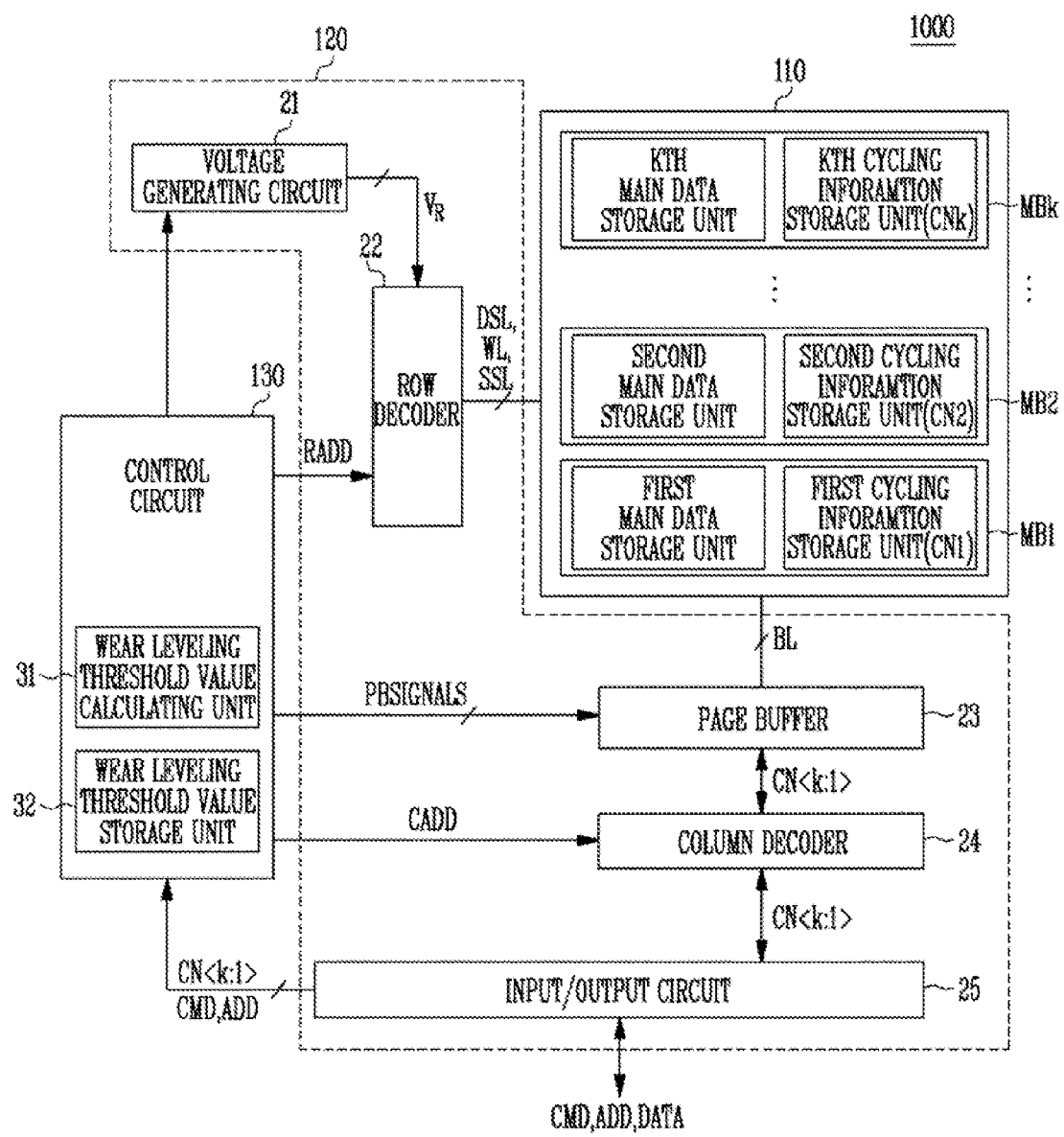
FIG. 1 is a diagram illustrating a semiconductor device according to an embodiment of the present invention.

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention. Throughout the disclosure, like reference numerals refer to like parts in the various figures and embodiments of the present invention.

The drawings are not necessarily to scale and, in some instances, proportions may have been exaggerated to clearly illustrate features of the embodiments. When an element is referred to as being connected or coupled to another element, it should be understood that the former can be directly connected or coupled to the latter, or electrically connected or coupled to the latter via an intervening element therebetween. Furthermore, when it is described that one "comprises" (or "includes") or "has" some elements, it should be understood that it may comprise (or include) or have only those elements, or it may comprise (or include) or have other elements as well as those elements if there is no specific limitation. The terms of a singular form may include plural forms unless otherwise stated.

FIG. 1 is a diagram illustrating a semiconductor device 1000 according to an embodiment of the present invention.

Referring to FIG. 1, the semiconductor device 1000 may include a memory cell array 110 in which data is stored, a circuit group 120 that performs erase, program, read, and wear leveling operations on the memory cell array 110, and a control circuit 130 that controls the circuit group 120 so that the erase, program, read, and wear leveling operations are performed.

The memory cell array 110 may include first to $k^{th}$ memory blocks MB1 to MBk (k is a positive integer). The first to $k^{th}$ memory blocks MB1 to MBk have the same configuration as each other, and share bit lines BLs. The first to $k^{th}$ memory blocks MB1 to MBk include first to $k^{th}$ main data storage units and first to $k^{th}$ cycling information storage units, respectively.

To describe based on a first memory block MB1, the first memory block MB1 may include a first main data storage unit and a first cycling information storage unit. The first main data storage unit and the first cycling information storage unit may include a plurality of cell strings with a two-dimensional (2D) or three-dimensional (3D) structure. For example, in the 2D cell string, memory cells are arranged in a direction parallel to a substrate, and in the 3D cell string, memory cells are arranged in a direction vertical to a substrate. Gates of the memory cells are connected to word lines WLs, source select transistors thereof are connected to source select lines SSLs, and drain select transistors thereof are connected to drain select lines DSLs, respectively. Drains of the drain select transistors are connected to the bit lines BLs, and sources of the source select transistors are commonly connected to a common source line (not shown). The memory cells are arranged between the drain select transistor and the source select transistor. When the memory cells included in the first main data storage unit are defined as main memory cells, memory cells included in the first cycling information storage unit may be defined as flag cells. Main data stored by a user may be stored in the main memory cells, and cycling information may be stored in the flag cells The cycling information includes information on cycling number (i.e., number of times of cycling). Further, various information about an operation of the semiconductor device may be stored in the flag cells.

Since the first to $k^{th}$ memory blocks MB1 to MBk perform different operations, different first to $k^{th}$ cycling information CN<K:1> may be stored in the first to $k^{th}$ cycling information storage units.

The circuit group 120 may include a voltage generating circuit 21, a row decoder 22, a page buffer 23, a column decoder 24, and an input/output circuit 25.

The voltage generating circuit 21 generates operation voltages VRs having various levels in accordance with erase, program, read, and wear leveling operations under the control of the control circuit 130. For example, the operation voltages VRs include voltages having various levels, such as an erase voltage, a program voltage, a read voltage, and a pass voltage.

The row decoder 22 selects one of the memory blocks included in the memory cell array 110 in response to a row address RADD, and transmits operation voltages to word lines WLs, drain select lines DSLs, and source select lines SSLs connected to the selected memory block.

The page buffer 23 is connected with the memory blocks through bit lines BLs, exchanges data with a selected memory block through the bit lines BLs in response to a page buffer control signal PBSIGNALS during the program read, or erase operation, and temporarily stores received data. For example, the page buffer 23 may receive first to $k^{th}$ cycling information CN<k:1> through the bit lines BLs.

The column decoder 24 exchanges data with the page buffer 23 in response to a column address CADD. For example, the column decoder 24 may receive the first to $k^{th}$ cycling information CN<k:1> from the page buffer 23.

The input/output circuit 25 transmits a command signal CMD and an address ADD received from the outside to the control circuit 130, transmits the data DATA received from the outside to the column decoder 24, and outputs the data DATA received from the column decoder 24 to the outside or transmits the data DATA received from the column decoder 24 to the control circuit 130. For example, the input/output circuit 25 may receive the first to $k^{th}$ cycling information CN<k:1> from the column decoder 24 and transmit the received first to $k^{th}$ cycling information CN<k:1> to the control circuit 130. The control circuit 130 outputs the row address RADD, the page buffer control signals PBSIGNALS, and the column address CADD for controlling the circuit group 120 in response to the command signal CMD, the address ADD, and the first to $k^{th}$ cycling information CN<k:1>. Particularly, the control circuit 130 includes a wear leveling threshold value calculating unit 31 and a wear leveling threshold value storage unit 32 for a wear leveling operation.

Figure 2:
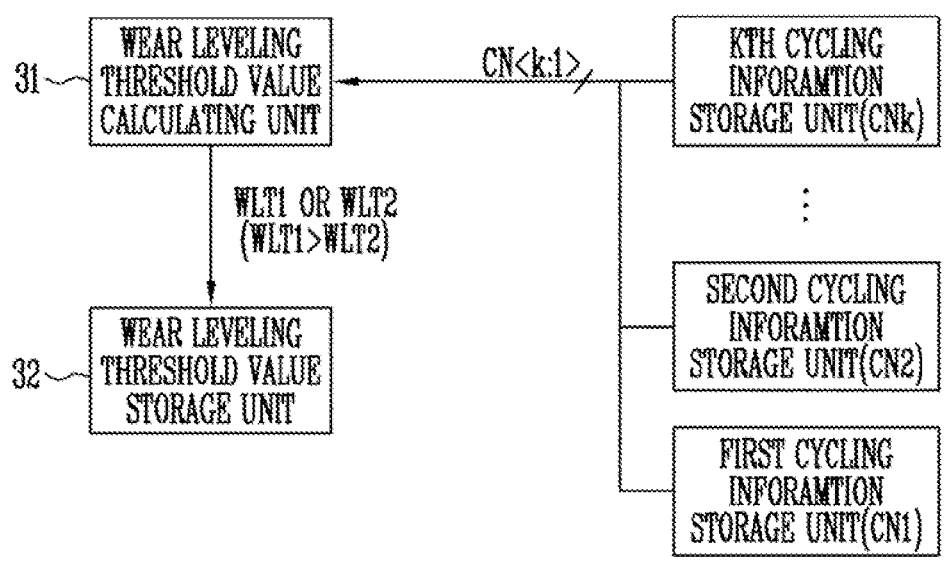
FIG. 2 is a block diagram for describing a wear management method of the semiconductor device shown in FIG. 1.

FIG. 2 is a block diagram for describing a wear management method of the semiconductor device 1000 shown in FIG. 1.

Referring to FIG. 2, the wear leveling threshold value calculating unit 31 calculates an average value of the cycling numbers of $k^{th}$ memory blocks MB1 to MBk (see FIG. 1) based on the first to $k^{th}$ cycling information CN<K:1> received from the first to $k^{th}$ cycling information storage units, compares the average value of the cycling numbers and a reference value of the cycling number, generates a first threshold value WLT1 or a second threshold value WLT2 less than the first threshold value WLT1 according to a comparison result, and calculates a difference between a maximum value and a minimum value of the cycling number. The first or second threshold value WLT1 or WLT2 generated by the wear leveling threshold value calculating unit 31 is stored in the wear leveling threshold value storage unit 32, The first and second threshold values WLT1 and WLT2 are reference values for performing a wear leveling operation.

The control circuit 130 controls the circuit group 120 so that a wear leveling operation is performed according to the difference between the maximum value and the minimum value of the cycling number and the first or second threshold value WLT1 or WLT2 calculated by the wear leveling threshold value calculating unit 31.

Figure 3:
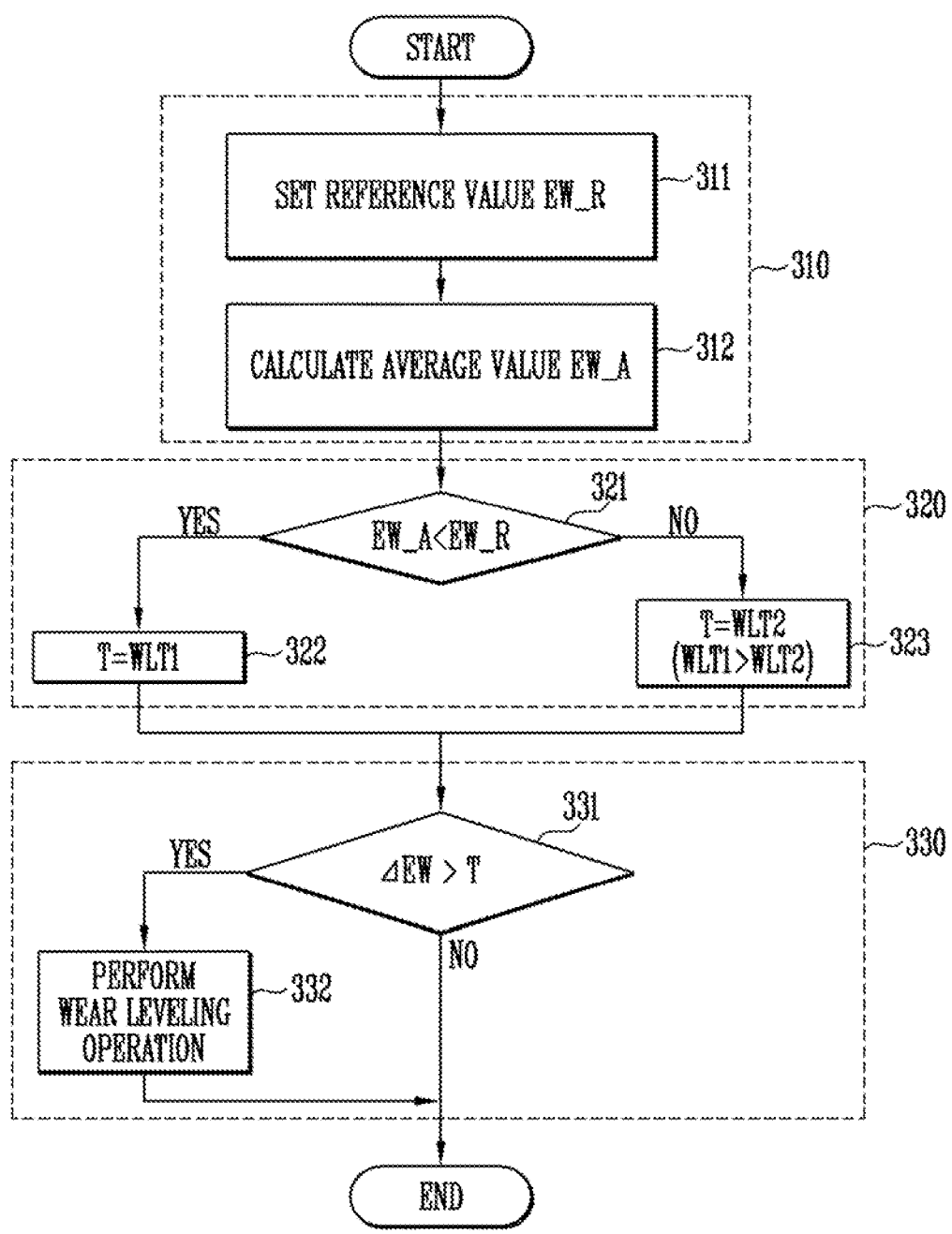
FIG. 3 is a flowchart for describing a wear management method of the semiconductor device shown in FIG. 1.

FIG. 3 is a flowchart for describing the wear management method of the semiconductor device 1000 shown in FIG. 1.

Referring to FIG. 3, the wear management operation of the semiconductor device may include calculating the cycling number (step 310), setting a cycling threshold value according to the calculated cycling number (step 320), and performing wear leveling according to the set threshold value (step 330).

The calculating of the cycling number (step 310) may include setting a reference value EW_R of the cycling number (step 311) and calculating an average value EW_A of the cycling numbers of memory blocks (step 312).

The setting of the cycling threshold value according to the calculated cycling number (step 320) may include comparing the average value EW_A of the cycling numbers and the reference value EW_R of the cycling number (step 321), and setting a threshold value T according to a comparison result (step 322 or 323).

The performing of the wear leveling according to the set threshold value (step 330) may include determining whether the wear leveling operation is demanded (step 331) and performing the wear leveling operation according to a determination result (step 332).

The wear leveling means an operation of decreasing a difference in wear of the memory blocks by exchanging data of different memory blocks when a difference in the cycling number of the memory blocks is great.

In the setting of the reference value EW_R of the cycling number (step 311), the cycling number, at which the memory blocks of the semiconductor device begins to be degraded, is set as the reference value EW_R of the cycling number. The reference value EW_R of the cycling number may be differently set according to a semiconductor device, and set through a test operation. For example, the test operation may be performed by repeating a test erase operation and a test program operation of the memory blocks included in the semiconductor device. When the test erase operation and the test program operation are repeated, the cycling number is increased, and when the cycling number is increased, the memory blocks are degraded. The cycling number, at which degradation degree of the memory blocks is increased, may be set as the reference cycling number.

The degradation degree of the memory blocks may be confirmed by various methods. For example, when the cycling number is increased, the number of electrons trapped in tunnel insulating layers of the memory cells is increased and a program operation time becomes fast. Accordingly, the cycling number at which the program operation time is fast may be set as the reference value EW_R of the cycling number. The reference value EW_R of the cycling number may be set once during the test operation of the semiconductor device and be omitted later. Data on the reference value EW_R of the cycling number may be stored in a CAM block among the memory blocks included in the memory cell array 110 (see FIG. 1) or a storage unit included in the control circuit 130 (see FIG. 1). When the reference value EW_R of the cycling number is set (step 311), calculating an average value EW_A of the cycling numbers of memory blocks (step 312) is performed.

In the calculating of the average value EW_A of the cycling numbers of memory blocks (step 312), an average of the cycling numbers of the first to $k^{th}$ memory blocks MB1 to MBk in a current state is calculated. For example, when k memory blocks are included in the memory cell array 110, the average value EW_A of the cycling numbers is calculated by summing the cycling number of each memory block and then dividing the summed value by k.

In the comparing the average value EW_A of the cycling numbers and the reference value EW_R of the cycling number (step 321), it is determined whether the average value EW_A of the cycling numbers is less than the reference value EW_R of the cycling number. When the average value EW_A of the cycling numbers is less than the reference value EW_R of the cycling number, it is determined that the semiconductor device is a little degraded state, and when the average value EW_A of the cycling numbers is equal to or greater than the reference value EW_R of the cycling number, it is determined that the semiconductor device is a severely degraded state. When the average value EW_A of the cycling numbers is less than the reference value EW_R of the cycling number, a first threshold value WLT1 is set as a threshold value T (step 322), and when the average value EW_A of the cycling numbers is equal to or greater than the reference value EW_R of the cycling number, a second threshold value WLT2 less than the first threshold value WLT1 is set as the threshold value T (step 323). The threshold value T is a reference for adjusting a frequency of occurrence of the wear leveling.

In the determining whether the wear leveling operation is demanded (step 331), a difference ΔEW (hereinafter, referred to as a difference value) in the cycling number between a memory block having the maximum cycling number and a memory block having the minimum cycling number among the memory blocks, and compares the difference value ΔEW and the threshold value T. When it is determined that the difference value ΔEW is equal to or less than the threshold value T, the wear leveling is not performed and the operation is terminated. When it is determined that the difference value ΔEW is greater than the threshold value T, the wear leveling is performed (step 332). That is, when a difference between the maximum value and the minimum value of the cycling number, the wear leveling operation is not performed, The wear leveling operation is an operation of changing data stored in the memory block having the maximum cycling number and the memory block having the minimum cycling number, As described above, the wear leveling operation is performed when the difference in the cycling number of the memory blocks reaches the threshold value T. The reach of the difference in the cycling number of the memory blocks to the threshold value T means that a wear deviation of the memory blocks is great, so that it is possible to decrease a wear difference between the memory blocks by performing the wear leveling operation. Particularly, it is possible to adjust a frequency of the performance of the wear leveling operation by changing the threshold value T, which is the reference of the performance of the wear leveling operation, according to wear states of the memory blocks. That is, when the wear states of the memory blocks are low, the great threshold value WLT1 is set to decrease the frequency of the performance of the wear leveling operation, and when the wear states of the memory blocks are high, the less threshold value WLT2 is set to increase the frequency of the performance of the wear leveling operation, thereby efficiently managing wear of the memory blocks.

Further, in the aforementioned method, one reference cycling number EW_R is set, but it is possible to decrease a wear difference of the memory blocks by setting a plurality of reference cycling numbers EW_R.

The wear leveling operation may be performed by various methods, but an embodiment of the wear leveling operation will be described with reference to the drawing for helping understanding.

Figure 4:
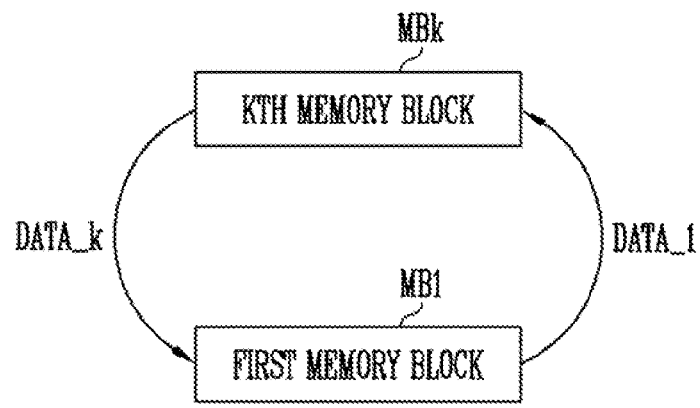
FIG. 4 is a diagram for describing a wear leveling operation according to an embodiment of the present invention.

FIG. 4 is a diagram for describing the wear leveling operation according to an embodiment of the present invention.

Referring to FIG. 4, the wear leveling operation may spread wear of the memory blocks by exchanging data of the memory clocks which have a great difference in the cycling number. For example, when a $k_{th}$ memory block MBk among the first to $k^{th}$ memory blocks MB1 to MBk has the maximum cycling number and the first memory block MB1 has the less cycling number, data stored in the first memory block MB1 is copied back to the $k^{th}$ memory block MBk, and data stored in the k$^{th}$ memory block MBk is copied back to the first memory block MB1. More particularly, the data stored in the first memory block MB1 is copied back to an extra block (not shown) and the first memory block MB1 is erased. The data stored in the k$^{th}$ memory block MBk is copied back to the first memory block MB1 and the k$^{th}$ memory block MBk is erased. The data stored in the extra memory block (not shown) is copied back to the kth memory block MBk, and the extra memory block (not shown) is erased.

Figure 5:
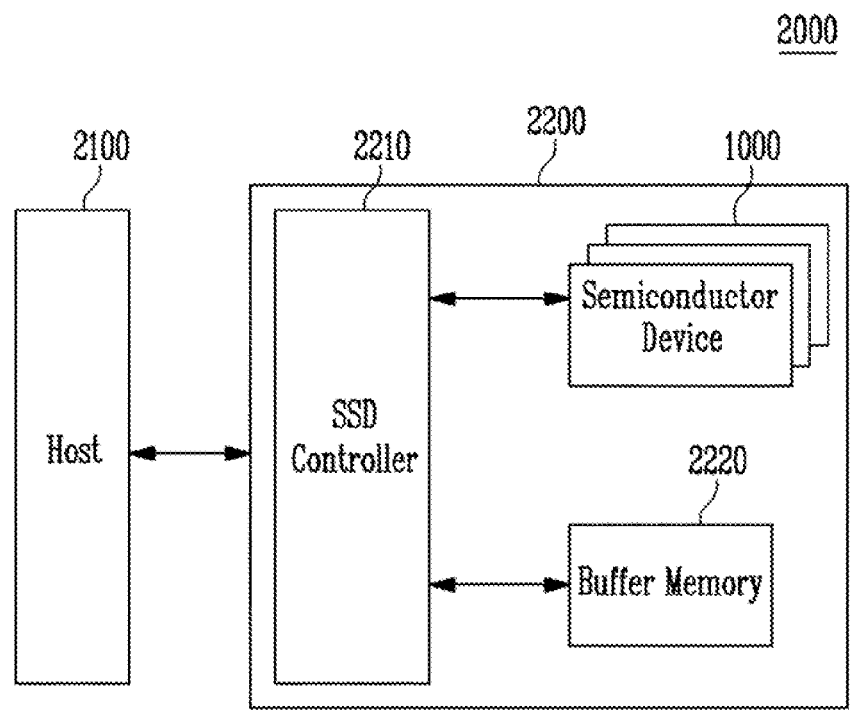
FIG. 5 is a block diagram illustrating a drive device according to an embodiment of the present invention.

FIG. 5 is a block diagram illustrating a drive device 2000 according to an embodiment of the present invention.

Referring to FIG. 5, the drive device 2000 may include a host 2100 and a solid-state drive (SSD) 2200. The SSD 2200 may include an SSD controller 2210, a buffer memory 2220, and a semiconductor device 1000.

The SSD controller 2210 physically connects the host 2100 and the SSD 2200. That is, the SSD controller 2210 provides interfacing with the SSD 2200 in accordance with a bus format of the host 2100. Particularly, the SSD controller 2210 decodes a command provided from the host 2100. The SSD controller 2210 accesses the semiconductor device 1000 according to a result of the decoding. The bus format of the host 2100 may include a Universal Serial Bus (USB), a Small Computer System Interface (SCSI), PCI process, ATA, Parallel ATA (DATA), Serial ATA (SATA), and Serial Attached SCSI (SCSI).

Program data provided from the host 2100 and data read from the semiconductor device 1000 is temporarily stored in the buffer memory 2220. When data existing in the semiconductor device 1000 is cached when a read request is made from the host 2100, the buffer memory 2200 supports a cache function of directly providing the cached data to the host 2100. In general, a data transmission speed by the bus format (for example, SATA or SAS) of the host 2100 may be faster than a transmission speed of a memory channel. That is, when an interface speed of the host 2100 is faster than the transmission speed of the memory channel of the SSD 2200, it is possible to minimize degradation of performance generated due to speed differences by providing the buffer memory 2220 with large capacity. The buffer memory 2220 may be provided as a synchronous DRAM so that the SSD 2200 used as an auxiliary memory device with large capacity provides sufficient buffering.

The semiconductor device 1000 is provided as a storage medium of the SSD 2200. For example, the semiconductor device 1000 may be provided as a non-volatile memory device having large capacity storage performance as described with reference to FIG. 1, particularly a NAND-type flash memory.

Figure 6:
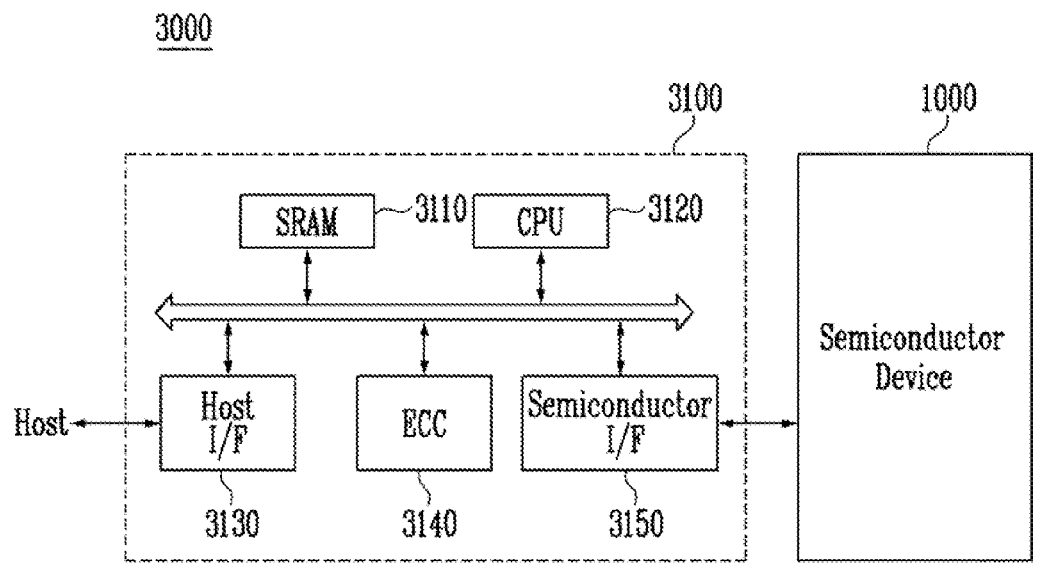
FIG. 6 is a block diagram illustrating a memory system according to an embodiment of the present invention.

FIG. 6 is a block diagram illustrating a memory system 3000 according to an embodiment of the present invention.

Referring to FIG. 6, the memory system 3000 may include a memory controller 3100 and a semiconductor device 1000.

The semiconductor device 1000 may have a configuration substantially the same as that of FIG. 1, so that a detailed description of the semiconductor device 1000 will be omitted.

A memory controller 3100 may control the semiconductor device 1000. The SRAM 3110 may be used as a working memory of a CPU 3120. A host interface (Host I/F) 3130 may include a data exchange protocol of a host connected with the memory system 3000. An error correction circuit (ECC) 3140 provided in the memory controller 3100 may detect and correct an error included in data read from the semiconductor device 1000. A semiconductor interface (semiconductor I/F) 3150 may interface with the semiconductor device 1000. The CPU 3120 may perform a control operation for exchanging data of the memory controller 3100. Although not illustrated in FIG. 9, the memory system 3000 may further include a ROM (not shown) for storing code data for interfacing with the host.

The memory system 3000 may be applied to one of a computer, a portable terminal, a Ultra Mobile PC (UMPC), a work station, a net-book computer, a PDA, a portable computer, a web tablet PC, a wireless phone, a mobile phone, a smart phone, a digital camera, a digital audio recorder, a digital audio player, a digital picture recorder a digital picture player, a digital video recorder, a digital video player, a device for communicating information in a wireless environment, and various devices for a home network.

Figure 7:
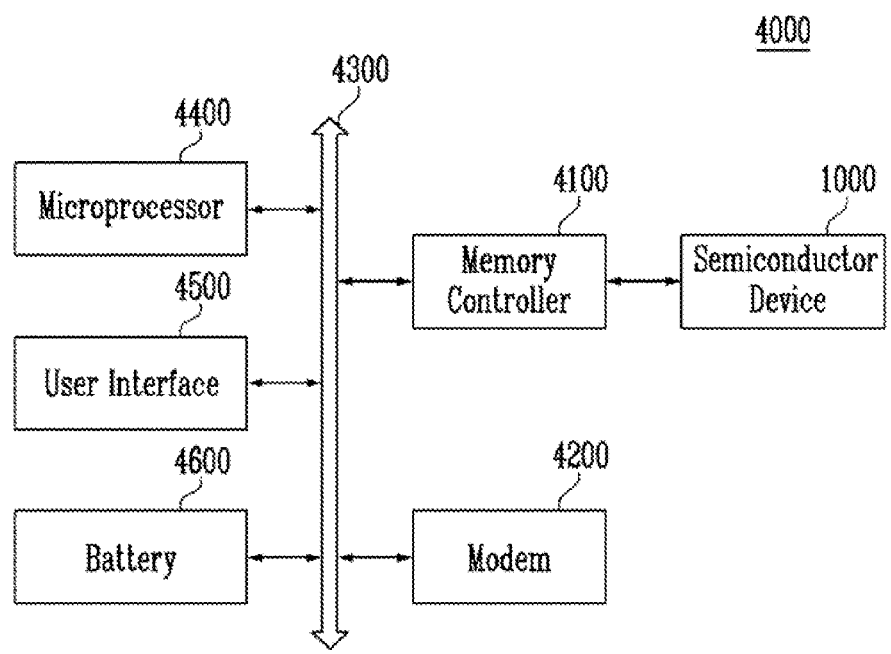
FIG. 7 is a diagram illustrating a computing system according to an embodiment of the present invention.

FIG. 7 is a diagram illustrating a computing system 4000 according to an embodiment of the present invention.

Referring to FIG. 7, the computing system 4000 may include a semiconductor device 1000, a memory controller 4100, a modem 4200, a microprocessor 4400, and a user interface 4500 which are electrically connected to the bus 4300. When the computing system 4000 is a mobile device, a battery 4600 for supplying an operating voltage of the computing system 4000 may be further provided. Although it is not illustrated in the drawing, the computing system 4000 may further include an application chipset, a camera image processor, a mobile DRAM, and the like.

The semiconductor device 1000 may have a configuration substantially the same as that of FIG. 1, so that a detailed description of the semiconductor device 1000 will be omitted.

The memory controller 4100 and the semiconductor device 1000 may form an SSD.

The semiconductor device and the memory controller may be embedded by using various forms of package. For example, the semiconductor device and the memory controller may be embedded using packages, such as package on package (PoP), ball grid arrays (BGAs), chip scale packages (CSPs), plastic leaded chip carrier (PLCC), plastic dual in line package (PDIP), die in waffle pack, die in wafer form, chip on board (COB), ceramic dual in line package (CERDIP), plastic metric quad flat pack (MQFP), thin quad flat pack (TQFP), small outline (SOIC), shrink small outline package (SSOP), thin small outline (TSOP), thin quad flat pack (TQFP), system in package (SIP), multi chip package (MCP), wafer-level fabricated package (WFP), and wafer-level processed stack package (WSP).

As described above, the embodiment has been disclosed in the drawings and the specification. The specific terms used herein are for purposes of illustration, and do not limit the scope of the present invention defined in the claims. Accordingly, those skilled in the art will appreciate that various modifications and another equivalent example may be made without departing from the scope and spirit of the present disclosure. Therefore, the sole technical protection scope of the present invention will be defined by the technical spirit of the accompanying claims.

What is claimed is:

1. A semiconductor device, comprising:
   memory blocks including main data storage units and cycling information storage units;
   a circuit group that performs a wear leveling operation on the memory blocks; and
   a control circuit that sets a threshold value based on the cycling information, and controls the circuit group so that the wear leveling operation is performed based on the set threshold value, wherein the circuit group includes:
  a page buffer that receives the cycling information stored in the memory blocks based on a page buffer control signal output from the control circuit;
  a column decoder that receives the cycling information from the page buffer based on a column address output from the control circuit: and
  an input/output unit that transmits a command signal and an address received from the outside to the control circuit, transmits data received from the outside to the column decoder, and transmits the cycling information received from the column decoder to the control circuit.

2. The semiconductor device of claim 1, wherein main data is stored in the main data storage units, and
  data on cycling numbers of the memory blocks is stored in the cycling information storage units.

3. The semiconductor device of claim 1, wherein the circuit group further includes:
  a voltage generating circuit that generates operation voltages having various levels used for the wear leveling operation under a control of the control circuit; and
  a row decoder that selects one of the memory blocks based on a row address output from the control circuit and transmits the operation voltages to the selected memory block.

4. The semiconductor device of claim 1, wherein the control circuit includes:
  a wear leveling threshold value calculating unit that calculates various values based on the cycling information; and
  a wear leveling threshold value storage unit that stores a first threshold value or a second threshold value that is less than the first threshold value, which are output from the wear leveling threshold value calculating unit.

5. The semiconductor device of claim 4, wherein the wear leveling threshold value calculating unit calculates an average value of cycling numbers of the memory blocks, and compares the average value and a reference value of the cycling numbers, outputs the first threshold value or the second threshold value based on a result of the comparison, and calculates a difference between a maximum value and a minimum value of the cycling numbers.

6. A method of operating a semiconductor device including a page buffer that receives a cycling information stored in memory blocks based on a page buffer control signal output from a control circuit, a column decoder that receives the cycling information from the page buffer based on a column address output from the control circuit, and an input/output unit that transmits a command signal and an address received from an outside to the control circuit, transmits data received from the outside to the column decoder, and transmits the cycling information received from the column decoder to the control circuit, comprising:
  setting a reference value of cycling numbers of memory blocks;
  setting a threshold value based on a result of a comparison between an average value of the cycling numbers and the reference value of the memory blocks; and
  performing a wear leveling operation based on the threshold value.

7. The method of claim 6, further comprising:
  performing a test operation for setting the reference value.

8. The method of claim 7, wherein the test operation includes:
  checking a degradation degree of the memory blocks while repeating a test erase operation and a test program operation of the memory blocks; and
  setting the cycling numbers when the degradation degree of the memory blocks is increased as the reference value.

9. The method of claim 7, wherein data on the reference value is stored in a CAM block included in a memory cell array or a storage unit included in a control circuit.

10. The method of claim 6, wherein the threshold value is set as a first threshold value when the average value is less than the reference value, and
  the threshold value is set as a second threshold value less than the first threshold value when the average value is equal to or greater than the reference value.

11. The method of claim 6, further comprising:
  calculating a difference value between a maximum value and a minimum value of the cycling numbers of the memory blocks between the setting of the threshold value and the performing of the wear leveling operation.

12. The method of claim 11, wherein, when the difference value is greater than the threshold value, the wear leveling operation is performed, and
  when the difference value is equal to or less than the threshold value, the wear leveling operation is skipped.

13. A method of operating a semiconductor device including a page buffer that receives a cycling information stored in memory blocks based on a page buffer control signal output from a control circuit, a column decoder that receives the cycling information from the page buffer based on a column address output from the control circuit, and an input/output unit that transmits a command signal and an address received from an outside to the control circuit, transmits data received from the outside to the column decoder, and transmits the cycling information received from the column decoder to the control circuit, comprising:
  performing a test operation for setting a reference value of cycling numbers of memory blocks;
  calculating an average value of the cycling numbers of the memory blocks;
  comparing the average value of the cycling numbers and the reference value;
  storing a first threshold value when the average value is less than the reference value, and storing a second threshold value less than the first threshold value when the average value is equal to or greater than the reference value;
  calculating a difference value between the cycling numbers of the memory block having maximum cycling numbers and the cycling numbers of the memory block having minimum cycling numbers among the memory blocks;
  comparing the difference value and the stored first or second threshold value; and
  performing a wear leveling operation when the difference value is greater than the stored first or second threshold value, and skipping the wear leveling operation when the difference value is equal to or less than the stored first or second threshold value.

14. The method of claim 13, wherein the wear leveling operation includes exchanging data of the memory block having the maximum cycling numbers with data of the memory block having the minimum cycling numbers among the memory blocks.

15. The method of claim 13, wherein the wear leveling operation includes:
  copying back data of the memory block having the minimum cycling numbers to an extra block;

erasing the memory block having the minimum cycling numbers; and copying back data of the memory block having the maximum cycling numbers to the memory block having the minimum cycling numbers;

erasing the memory block having the maximum cycling numbers;

copying back the data of the extra block to the memory block having the maximum cycling numbers; and erasing the extra block.

* * * * *